(12) United States Patent
Kawaguchi et al.

(10) Patent No.: US 8,946,740 B2
(45) Date of Patent: Feb. 3, 2015

(54) LED PLATFORM WITH MEMBRANE

(75) Inventors: Hiroaki Kawaguchi, Aichi (JP); Nick Shepherd, Birgitz (AT)

(73) Assignee: Lexedis Lighting GmbH, Jennersdorf (AT)

( * ) Notice: Subject to any disclaimer, the term of this patent is extended or adjusted under 35 U.S.C. 154(b) by 1492 days.

(21) Appl. No.: 12/296,269

(22) PCT Filed: Apr. 23, 2007
(Under 37 CFR 1.47)

(86) PCT No.: PCT/EP2007/003550
§ 371 (c)(1),
(2), (4) Date: Sep. 7, 2011

(87) PCT Pub. No.: WO2007/121973
PCT Pub. Date: Nov. 1, 2007

(65) Prior Publication Data
US 2012/0187432 A1   Jul. 26, 2012

(30) Foreign Application Priority Data

Apr. 21, 2006   (EP) ..................... 06008292

(51) Int. Cl.
*H01L 33/64*    (2010.01)
*H01L 33/48*    (2010.01)

(52) U.S. Cl.
CPC ............ *H01L 33/642* (2013.01); *H01L 33/486* (2013.01); *H01L 2224/32225* (2013.01);
(Continued)

(58) Field of Classification Search
CPC ................. H01L 2924/0002; H01L 2924/00; H01L 33/486; H01L 33/642; H01L 2924/12041; H01L 23/49833; H01L 23/49861; H01L 27/14618; H01L 33/46
USPC ............. 257/98, E33.072, E33.057, E33.075; 438/42, 26
See application file for complete search history.

(56) References Cited

U.S. PATENT DOCUMENTS 6,518,600 B1   2/2003   Shaddock
6,531,328 B1   3/2003   Chen
(Continued)

FOREIGN PATENT DOCUMENTS

EP   0 684 648   11/1995
EP   1 179 858   2/2002
(Continued)

OTHER PUBLICATIONS

International Search Report for PCT/EP2007/003550 dated Jul. 13, 2007.
(Continued)

*Primary Examiner* — Duy T. Nguyen
(74) *Attorney, Agent, or Firm* — Marshall Gerstein & Borun LLP

(57) ABSTRACT

An LED package comprises:
an LED chip having an optically active layer on a substrate,
a platform, including a central membrane of which the LED chip is mounted in close thermal contact to the material of the platform,
the thickness of the membrane being less than 3/10 the chip dimension (L)
the thickness of the supporting frame being more than twice the membrane thickness, typically 10 times and possibility up to 25 times which is integrally formed with the membrane, is substantially larger than the thickness of the membrane,
wherein the membrane is provided with at least an electrically isolated through contact filled with electrically conducting material and connected to one of the electrodes of the LED chip.

30 Claims, 10 Drawing Sheets

(52) U.S. Cl.
CPC ............... *H01L2224/48091* (2013.01); *H01L 2224/48227* (2013.01); *H01L 2224/73265* (2013.01); *H01L 2224/45144* (2013.01)
USPC .................. 257/98; 257/E33.072; 438/26

(56) References Cited

U.S. PATENT DOCUMENTS

| | | | |
|---|---|---|---|
| 7,528,422 B2 * | 5/2009 | Murphy | 257/99 |
| 2002/0113245 A1 * | 8/2002 | Lin | 257/99 |
| 2003/0153108 A1 * | 8/2003 | Durocher et al. | 438/26 |
| 2004/0119078 A1 * | 6/2004 | Konno et al. | 257/79 |
| 2004/0120155 A1 | 6/2004 | Suenaga | |
| 2004/0173808 A1 * | 9/2004 | Wu | 257/99 |
| 2005/0051792 A1 * | 3/2005 | Sasuga | 257/99 |
| 2005/0263312 A1 * | 12/2005 | Bolken et al. | 174/52.4 |
| 2006/0001055 A1 | 1/2006 | Ueno et al. | |
| 2006/0138436 A1 * | 6/2006 | Chen et al. | 257/98 |
| 2006/0157828 A1 * | 7/2006 | Sorg | 257/666 |
| 2006/0163596 A1 | 7/2006 | Kim et al. | |
| 2006/0183625 A1 | 8/2006 | Miyahara | |

FOREIGN PATENT DOCUMENTS

| | | |
|---|---|---|
| EP | 1 605 523 | 12/2005 |
| JP | 2006059924 | 3/2006 |
| WO | WO-2004005216 | 1/2004 |

OTHER PUBLICATIONS

International Preliminary Report on Patentability for PCT/EP2007/003550 dated Jun. 5, 2008.

* cited by examiner

Example of the thin silicon membrane and supporting frame

LED chip designs - conductive feed-through substrates

FU no wire bond with feed through on the LED substrate. Conductive substrate.

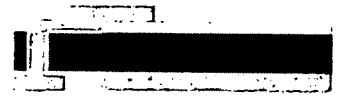

Note one contact is isolated from the conducting substrate

FU no wire bond. The anode and cathode are independent from the direct thermal path

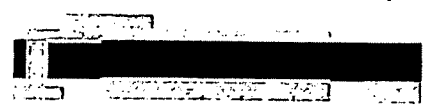

Note one contact is isolated from the conducting substrate and the thermal contact is electrically isolated

Figure 8

Membrane designs for chip and electrical contact variations (1)
- A. (V0) 2 wire bonds (sapphire electrically isolating)
- C. (V1) FU 1 wire bond, one electrical contact also forms the thermally conducting path. Membrane in electrical path
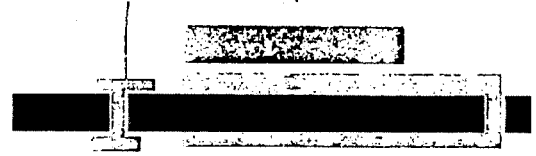
- B. (V0) FC no wire bonds. Thermal path electrically isolated
- D. (V1) FU no wire bond with feed through on the LED substrate
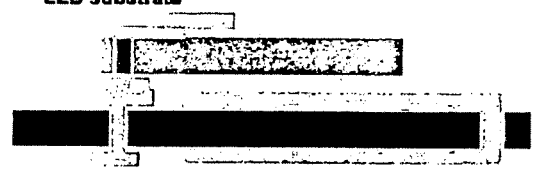
Figure 9

Membrane designs for chip and electrical contact variations (2)

C. (V2 )FU 1 wire bond, electrical contact independent of the thermally conducting path. Membrane not in electrical path

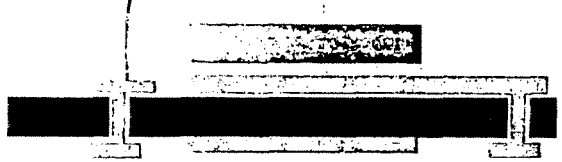

E. (V0) FU no wire bond. The anode and cathode are independent from the direct thermal path. Membrane not in electrical path

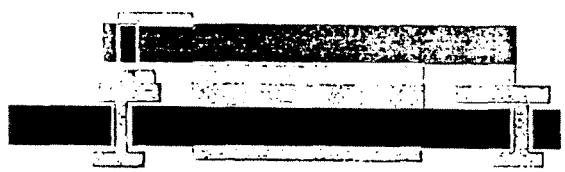

D. (V2) FU no wire bond with feed through on the LED substrate. Membrane not in electrical path

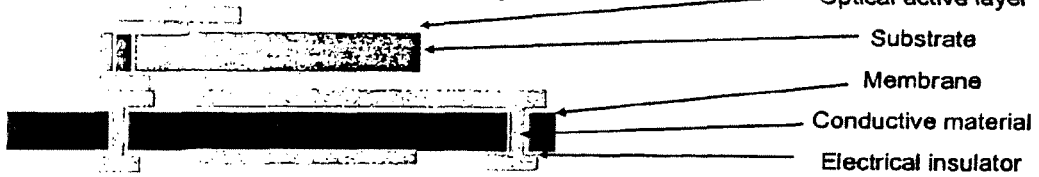

— Optical active layer
— Substrate
— Membrane
— Conductive material
— Electrical insulator

Figure 10

Membrane design variations for chip and electrical contact variations (3)

- A. (V3) 2 wire bonds (sapphire electrically isolating) vertical electrical isolation only

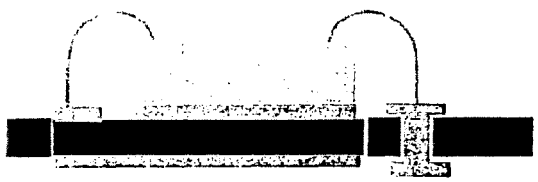

- B. (V3) FC no wire bonds. Thermal path electrically isolated (

C. (V3) FU 1 wire bond, one electrical contact also forms the thermally conducting path. Membrane in electrical path

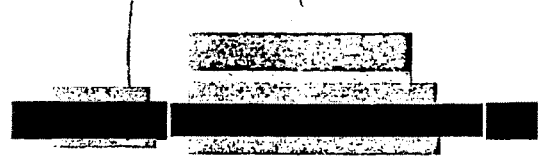

D. (V3) FU no wire bond with feed through on the LED substrate

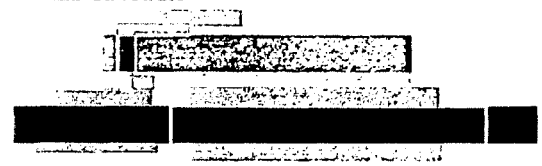

Figure 11

Membrane designs for chip and electrical contact variations (4)

C. (V3 )FU 1 wire bond, electrical contact independent of the thermally conducting path. Membrane not in electrical path

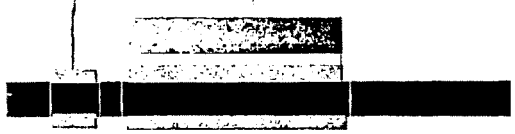

D. (V3) FU no wire bond with feed through on the LED substrate. Membrane not in electrical path

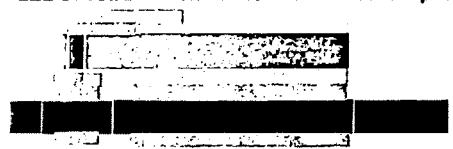

E. (V1) FU no wire bond. The anode and cathode are independent from the direct thermal path. Membrane not in electrical path

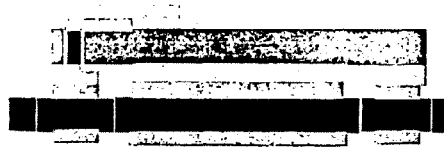

F. (V4) FU no wire bond with feed through. No LED substrate. Membrane isolated from electrical path

Figure 12

LED PLATFORM WITH MEMBRANE

CROSS-REFERENCE TO RELATED APPLICATIONS

This is the US national phase of International Patent Application PCT/EP2007/003550 filed Apr. 23, 2007, which claims the priority benefit of European Patent Application No. EPO 06008292.2 filed Apr. 21, 2006, the entire respective disclosures of which are incorporated herein by reference.

BACKGROUND OF THE INVENTION

1. Field of the Invention

The present invention relates to an LED platform having an LED chip on a membrane.

2. Related Technology

It is known to provide high brightness (HB) LEDs and mid-power LEDs in a so-called package, in which the LEDs are mounted on a supporting substrate.

The LED chip thereby is mounted on a submount comprising some dielectric material that has mechanical properties and relatively good thermal conductivity. The currently used materials for the substrate and the submount require a minimum manufacturing thickness.

For the face-up (FU) LED chip design the substrate of the LED chip can be bonded to the submount using an adhesive or solder.

The present development of flip chip (FC) technology is to minimize the thermal path to the package allowing improved thermal control of the light emitting semiconductor material. For FC application bonding techniques such as gold stud bump bonding can be used that only connects the two components at a low percentage of the LED electrode area. However, this mounting technique is expensive and offers limited mechanical support and limited thermal properties.

The electrical solder connections are ideally on the opposite face to the LED mounting. These interconnections add cost and complexity to the design and can be difficult to achieve in practice in metal or dielectric materials especially at a thin material thickness. Currently alternative methods for making the contacts to the solder face are preferred to the fabrication of electrical feed-throughs.

The LED chip and sub-mount assembly are then mounted into some final package to allow the electrical contacts and light output to be established.

Now, there is the problem that high brightness (HB) LED chips are operated with increasing power. The light conversion efficiency of the LED chip is quite low, thus that the heat generated by the LED chip has to be removed to the ambient through package material. The majority of the costs incurred by packaged LEDs are still dominated by the material costs, which in addition to the LED can be relatively high compared to the overall manufacturing costs.

It is a problem that often the combination of the LED substrate, the submount and the package material represents the weakest link for the heat transfer from the chip to the ambience. Thermally well conducting material such as metal mounts cannot be used alone, as the electrical contacts to the LED have to be electrically isolated. While this is possible, these materials create a decrease in the thermal conductivity that limits the physical size and power of the chips that can be used in this package to low power devices (e.g. Dimensions typically <300 μm and operating power <100 mW). For high power devices (chip dimensions typically >300 μm and operating powers typically >300 mW), the whole metal housing also heats excessively and this can adversely affect the long-term performance of the LED light source, as all these components are typically temperature sensitive.

Where the LED chip does not have uniform dimensions, i.e. no square shape, the operating power is typically the dominant characteristic and the average chip dimension can be used to define the (effective) chip length (L) where the chip area (L×L) is reasonably accurate.

Using thicker dielectric materials with a very high thermal conductivity represents advantages for a submount, but involves high costs and places constraints on the overall device design.

Additionally, the submount must provide for a stable mechanical support for the LED. This requires minimum thickness of the submount. There are conflicting requirements between the ability to conduct the heat away from the LED and the ability to provide a mechanical support for the LED. It is known that reducing the thickness increases the manufacturing costs and makes the use of discrete submounts almost impossible to handle without breaking during the normal LED assembly processes.

At the present time, the design is typically to ensure the mechanical properties of the package at reasonable cost and to accept the then thermal performance that is achieved.

GENERAL DESCRIPTION

Therefore, the invention provides an LED packaging technique without using a discrete submount that allows improved thermal characteristics in a direction perpendicular from the heat source while maintaining the required mechanical support and thermal isolation of the overall package from the LED generated heat.

Accordingly, the invention provides an LED package, comprising:

an LED chip having an optically active layer on a substrate of minimum dimension L, and a platform, formed by a supporting frame surrounding a recessed membrane on which the LED chip is mounted in close thermal contact to the material of the platform, wherein the membrane is provided with one or a plurality of electrically isolated through contacts made from electrically conducting material and connected to one of the electrodes of the LED chip.

The invention also provides a method for manufacturing an LED package, comprising the steps of:

preparing a platform having a membrane with a thickness of some 3/10 or less of the LED chip dimension and a frame integrally formed with the membrane and having a thickness which is substantially larger than the thickness of the membrane, wherein during the preparation the membrane is always supported by the frame, and mounting an LED chip on the membrane.

According to a first aspect of the present invention, an LED platform (LED package) is proposed comprising an LED chip having an optically active layer on a substrate. The LED chip is fixed to a recessed surface of a cavity formed in the platform and is in thermal contact to the material of the membrane of the platform. The technique also lends itself advantageously to one or more electrical feed-through in the thin membrane material.

The thickness of a frame of the platform that is integrally formed with the membrane of the cavity and preferably surrounds the cavity, is made substantially larger than the thickness of the cavity. For the membrane thickness h and the frame thickness H forming the platform the ratio of the thickness is from (h/H) 1/25 to 1/2 typically.

According the conventional mechanics and package design philosophy, these low ratios allow a membrane thickness that is not mechanically very stable for the conventional LED package.

The LED substrate has a thickness which as such is not as critical as the thermal conductivity of the LED substrate. The thermal conductivity of the LED substrate should be as high as possible. Clearly, a thin LED substrate is advantageous; indeed, no substrate from a thermal perspective would be ideal. In this case just the bonding material and the optically active layer could be advantageously combined.

The LED chip substrate can be made from sapphire, silicon or silicon carbide.

The platform can be made from silicon or silicon carbide or glass.

The walls of the cavity surrounding the membrane can be designed as serving as a reflector for light emitted from the LED chip.

The walls of the cavity can be coated with a reflecting material.

Preferably the thermal resistance of the membrane of the platform is less than 7 K/W in the direction perpendicular to the LED emitting surface and greater than this in the direction parallel to the emitting surface.

The frame of the membrane has a thickness of at least twice the membrane thickness, preferably more than 5 times, up to 25 times which is substantially more than the thickness of the membrane.

The cavity can be at least partially filled with a color conversion material being in contact or spatially separated from the LED chip.

The membrane can be provided with at least a through hole filled with electrically isolating and conducting material and connected to one of the electrodes of the LED chip.

The completed structure is such that the whole of the cavity can remain sealed from one side of the membrane to the other once the platform fabrication is completed.

In case of using the high power chip technology, the membrane can be provided with two through holes respectively filled with electrically isolating and conducting material and connected to one of the electrodes of the LED chip.

A still further aspect of the present invention relates to a manufacturing method for an LED package. A platform is prepared having a membrane with a thickness relative to the frame of some ½ to ½5 or less and a frame integrating formed with and essentially surrounding the membrane and having a thickness, which is essentially larger than the thickness of the membrane. Thereby, during the preparation of the membrane, the thicker frame always supports the membrane. Finally, an LED chip is mounted on the membrane.

The step of mounting the LED chip can comprise selecting LED chip having a substrate with a thickness such that the substrate of the LED chip, together with the frame of the platform, procure sufficient mechanical and thermal properties to the LED package.

This can be achieved by using a ratio of the LED chip dimension (L) to the membrane thickness (h) such that the ratio (h/L) is less than 3/10 and typically 1/10 and at most 1/25.

Therefore, the invention proposes to select a matching combination of the materials of the substrate of the LED chip and the material and the thickness of the membrane, respectively.

The method can comprise selecting the materials of the LED chip substrate and the platform, respectively, such that they have essentially comparable thermal characteristics.

The thermal resistance of the materials forming the membrane can be selected to be some 10 K/W and preferentially 7 K/W or less.

The invention therefore proposes to use an LED chip on a supporting substrate and a thin membrane defined in the overall platform in order to have the necessary mechanical and thermal properties.

Preferably silicon can be used as a material for the platform, as the thermal conductivity of silicon is relatively high and the native silicon oxide can be used as an electrical isolator. The thickness of the native silicon oxide is preferably less than 0.5 µm and greater than 0.05 µm.

The thin oxide layer is necessary to minimize the thermal resistance while maintaining electrical isolation for normal operation of the LED.

Further on, in case the LED chip substrate is made from sapphire, it is of advantage that the CTE (coefficient of thermal expression) of sapphire and silicon essentially similar. Ideally, the LED chip substrate is also made from silicon.

BRIEF DESCRIPTION OF THE DRAWINGS

Further advantages, features and objects of the present invention will now become evident of the man skilled in the art with reference to the following detailed description of preferred embodiments taken in conjunction with the thickness of the enclosed drawings.

FIG. 8 shows different feed through approaches, FIG. 9 shows different silicon membrane with corresponding electrical contacting, and FIGS. 10 to 12 show further silicone membrane designs with electrical feed through contacting.

DETAILED DESCRIPTION

The development of high power (high output flux) LED has resulted in chip designs using both larger chip dimension (L) with thicker optical transparent supporting substrate and larger chip dimension (L) with thinner optically opaque substrate with high thermal conductivities, wherein in each case the optical emitting layer is different to the supporting substrate.

The invention proposes to use a LED chip with a large (L>300 µm) and (relatively thick) substrate e.g. made from sapphire, and large (L>300 µm) relatively thin substrate, e.g. made from silicon or silicon carbide. The substrate can be optically transparent or optically opaque. The transparent substrate can have a thickness of more than three times the membrane thickness, up to five times and possibly more than seven times. As the thickness increases the thermal properties of the structure become less favorable.

The opaque material can have a thickness less than 3 times the membrane thickness, preferably similar in thickness and ideally no substrate is used.

As the thickness decreases in each case the thermal properties of the structure become more favorable.

Therefore, according to the invention, the relatively large LED chip substrate can be used in order to promote the mechanical characteristics of the overall platform and the thermal resistance, i.e. the combination of the LED chip and the membrane according the ratio (h/L). A large LED chip thus improves the thermal conductivity.

The invention proposes to make advantage of the fact that such a supporting substrate is mechanically more robust than the optical emitting layer (e.g. GaN, GaAs).

Figure 1:
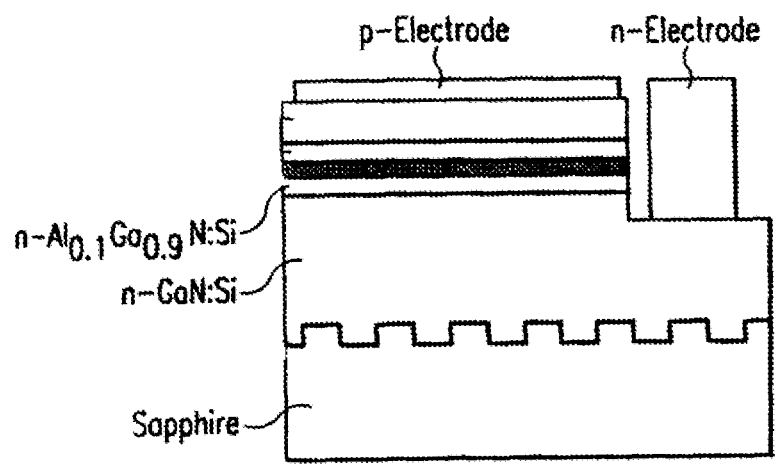
FIG. 1 shows schematically an LED chip which can be used in connection with the present invention and which has a sapphire substrate.

FIG. 1 shows an example of an LED chip that can be used in connection with the present invention.

Of importance is especially the relatively thick sapphire substrate, which can be patterned.

Figure 2:
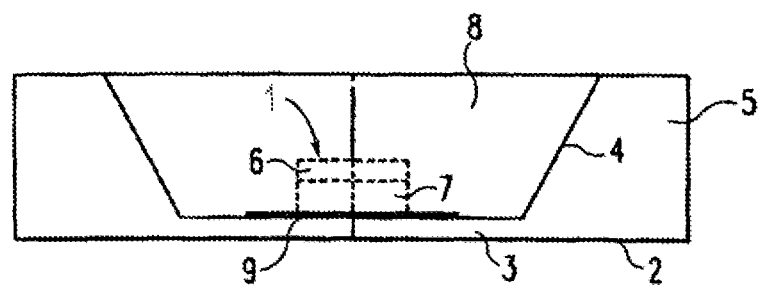
FIG. 2 shows schematically an example of a platform according to the present invention having a thin silicon membrane and a relatively thick, integrally formed supporting frame.

Now, the invention proposes to use an LED chip 1 having an optically active layer 6 on a substrate 7 in connection with a platform 2 as shown in FIG. 2.

This platform 2 has a cavity 8, the bottom of which is formed by a recessed and relatively thin membrane 3 surrounded by a supporting frame 5 that is relatively thick and thus solid in comparison to the thin membrane 3. The LED chip 1 can be mounted to the membrane 3 for example by using an adhesive or by soldering 9.

According to the invention, the thickness of the membrane 3 is less than twice, preferably less than 5 times and most preferred less than 25 times the thickness of the frame.

The membrane 3 is made integrally with the supporting frame 5 and thus from the same material as the supporting frame 5.

The walls 4 of the cavity 8 can be of any shape, such as e.g. vertical, curved or as shown inclined e.g. in an angle of between 40 and 60 degrees.

The walls 4 of the cavity 8 can serve as a reflector, and, to this regard, can be coated with a reflecting material.

Figure 3:
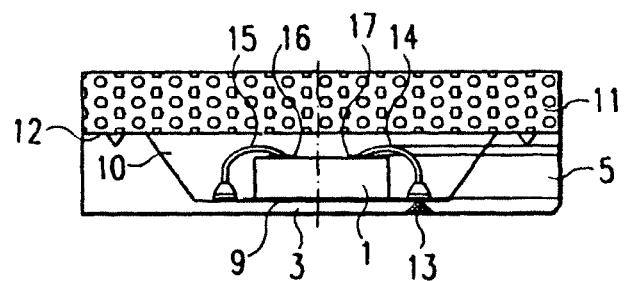
FIG. 3 shows an example of an LED package having a FU (face up) mount.

FIG. 3 shows a face up (FU) LED chip 1 which is placed on the thin membrane 3 and mechanically connected to the membrane 3 e.g. by soldering 9, by a conducting epoxy etc.

The two electrodes 16, 17 at the top of the LED chip 1 is electrically connected e.g. via gold (Au) wire bonding 14, 15.

After having placed the LED chip 1, the cavity 8 is filled, e.g. with a clear sealing silicone 10.

Preferably on top of the platform 2 with filled cavity 8 a color conversion material 11 can be placed overlapping also the regions of the platform 2 outside the cavity 8, i.e. the top surface 12 of the supporting frame 5.

The bond wire 14 of at least one electrode 17 can be led to the outside through conducting portions in the membrane, which conducting portions are electrically isolated against the surrounding portion of the silicon platform. The conducting portions can be made from a conductor such as e.g. metal or a semiconductor such as e.g. silicon. The isolation can be achieved e.g. by oxidizing silicon.

The conducting portion in the silicon membrane can be relatively small ("hole") or cover an area such as e.g. the entire base of the LED chip.

One or both electrodes of the LED chip can be fed through the silicone membrane.

The LED chip can be mounted face-up or face-down.

The shown embodiment proposes a filled through hole 13 in the membrane 3, the conducting filling being e.g. made from gold or a combination of metals or other electrically isolated conducting materials. The filling is electrically isolated against the surrounding silicon, e.g. by applying an isolating layer before providing the filling.

Figure 4:
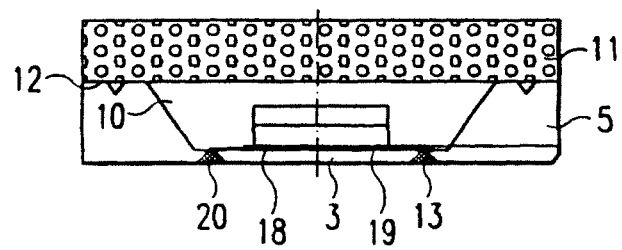
FIG. 4 shows an example of a FC (flip chip) LED chip mount.

FIG. 4 shows an example for a LED chip 1 that is mounted according to flip chip (FC) technology. Again, the cavity 8 can be filled, or partially filled, with clear silicone 10 and a color conversion material 11 can be placed on top of the filled cavity 8 and the top surface 12 of the surrounding support frame 5.

The cathode and the anode of the LED chip 1 are facing the membrane 3.

There is a separate solder patch 18 for the cathode and a solder patch 19 for the anode, which solder patches are respectively provided on the membrane 3. AuSn can be used as solder material. The composition of the AuSn solder is ideally 80:20 wt % and preferably formed with excess deposited gold.

In the membrane 3, there is respectively an insulated conducting material-filled through hole 20 for the cathode and a through hole 13 for the anode.

Figure 5:
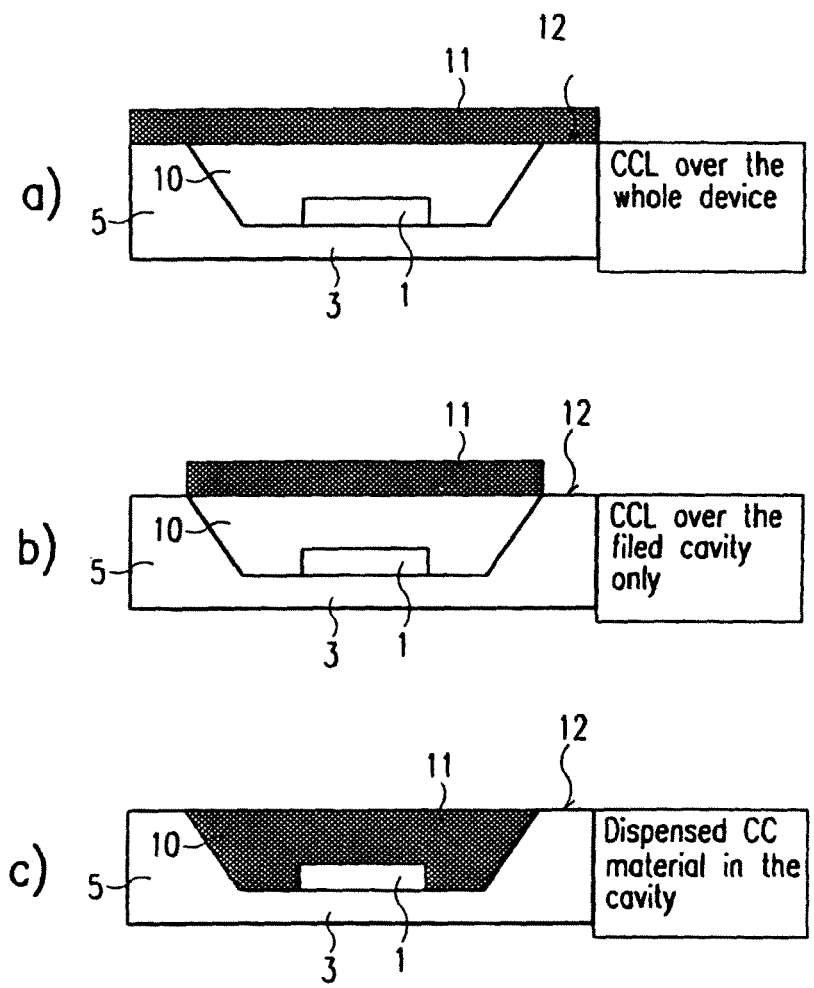
FIG. 5 shows different possibilities of providing a color conversion material above and/or surrounding the LED chip.

With reference to FIG. 5 now different arrangements for the colour conversion material will be explained.

In FIG. 5a schematically the arrangement as shown in FIGS. 3 and 4 is illustrated. According to this embodiment a color conversion layer 11 is covering both the cavity 8 (which can filled or "empty") and the surrounding top surface 12 of the support frame 5.

According to FIG. 5b the cavity 8 is, again, optionally filled with a clear silicone material 10, while according to this embodiment, the color conversion layer 11 covers the top face of the cavity 8 only, but not the top surface 12 of the support frame 5.

According to FIG. 5c, the embodiment has color conversion material 11 directly filling the cavity 8 such that the top surface of the color conversion material is flush or higher than the top surface 12 of the surrounding support frame 5.

According to present invention, the thin membrane for example from silicon material is always supported, i.e. throughout the entire manufacturing process, by the surrounding support frame which is made from the same material, but of greater thickness. This design can be manufactured by using silicon micro-machining (MEMS) in order to produce a precisely defined thin membrane with low thermal resistance and the integral mechanical support around the membrane.

The cavity can be formed from a silicon wafer using a choice of controlled MEMS fabrication techniques.

Additionally, the cavity walls can be coated with a suitable reflecting material, such as for example aluminum and/or silver.

According to the invention, an excellent thermal performance of the package of less than 7 K/W across the thin membrane can be achieved. Where the ideal material combination of LED chip substrate and the thin membrane are used, the thermal performance of the platform of less than 15 K/W across the LED substrate and the membrane can be achieved.

Preferably, the thermal properties of the membrane material are similar to the properties of the LED sapphire substrate or other bonded supporting material. This prevents undesirable thermal stresses and the package during the temperature range that can be expected during the assembly and operation of the LED package.

The design of the solder path as shown in FIGS. 3 and 4 is such that the area under the package is maximized to effectively spread the heat transfer over the membrane surface when finally soldered, and away from the platform. In particular, the electrode area is designed to correspond directly with the contour of the LED chip so minimal lateral spreading of the heat occurs from the membrane to the supporting frame.

This ensures that the frame of the platform has limited heating by the LED chip and the heat is directed away in a direction perpendicular to the membrane.

The frame of the platform should not become hot during the normal operation of the packaged LED as the heat is conducted down into the underlying construction and not into the frame by heat spreading. This is advantageous for the optical performance of the complete device.

Regarding the electrical connection to the solder path, the native oxide on the silicon can be used as an electrical isolator to separate the anode and cathode of the LED chip. As shown in FIGS. 3 and 4, the electrical connections can be advantageously realized through the thin membrane or on the surface of the package to the upper surface.

Figure 6:
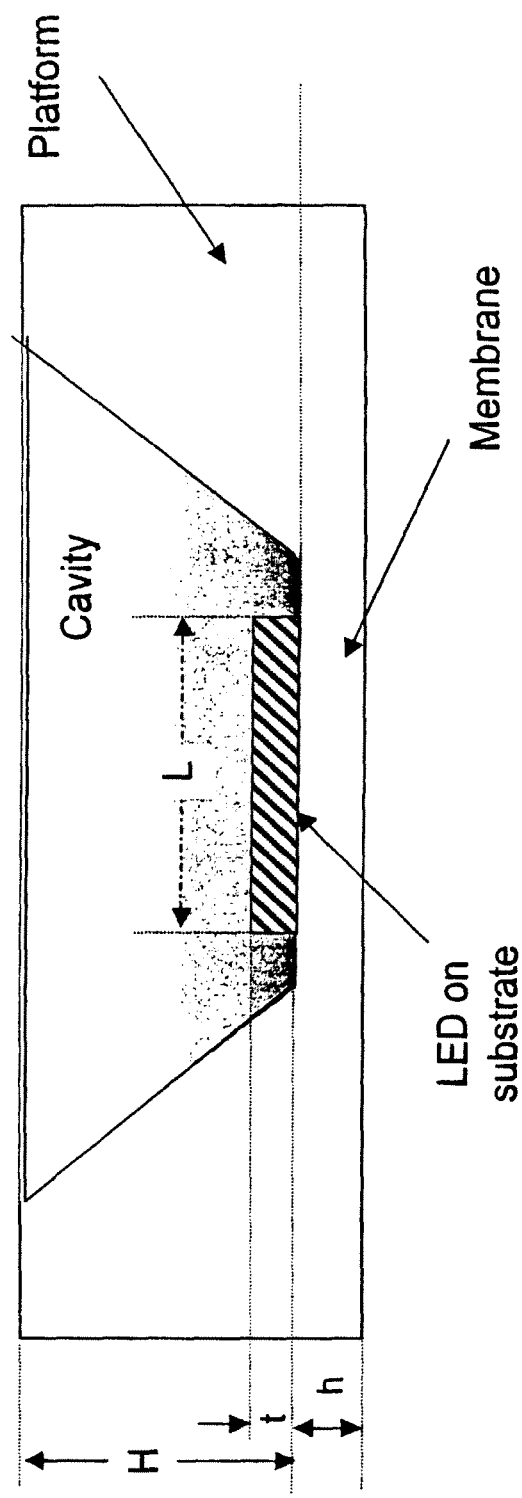
FIG. 6 shows the dimensions of the platform with the chip as described in the text for the dimensions h, H, L, and t.

In the example shown in FIG. 6 the membrane has a constant thickness.

Figure 7:
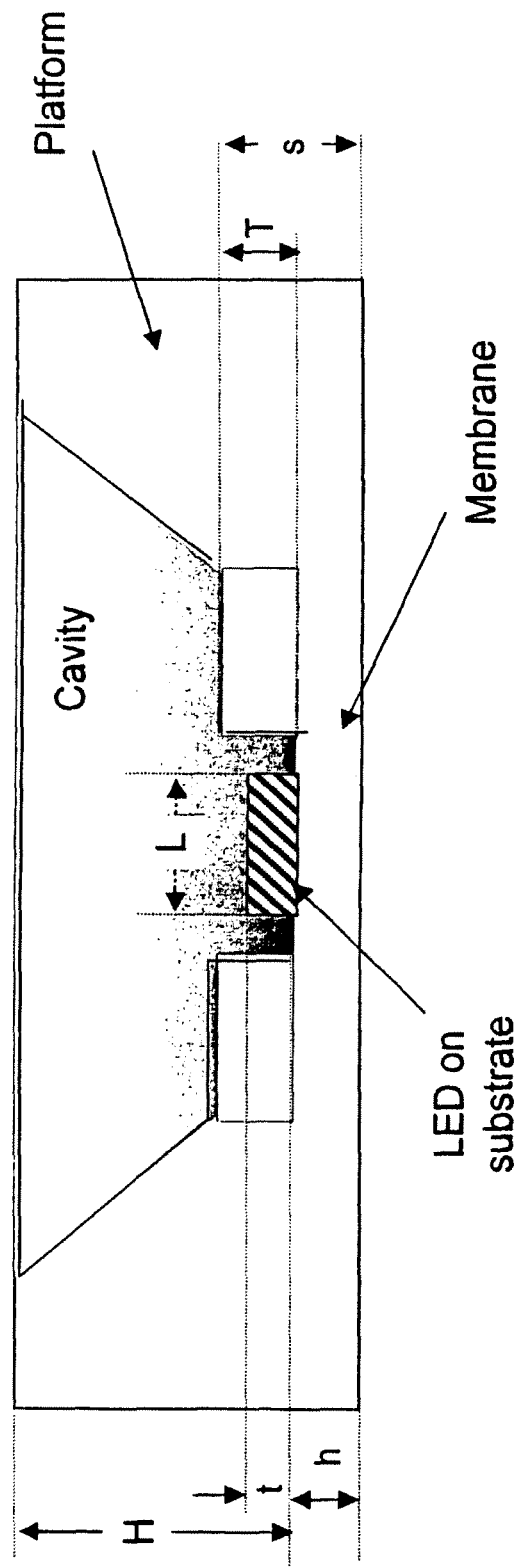
FIG. 7 shows an example of a membrane having a non-uniform thickness.

FIG. 7 shows an embodiment of the invention in which the membrane has a varying thickness. In the shown example the membrane has a central recessed (and thinner) portion having a reduced thickness (s-T) in comparison to the surrounding thickness s. The LED chip is mounted in the area having the reduced thickness.

The thickness variation of the membrane can be gradually or, as shown in FIG. 7, in a stepped manner.

The feedthrough technology and its applications to different chip designs according to the present invention will now be further explained with reference to FIGS. 8 to 12.

The invention can be used e.g. in context with the following chip designs:
Face-up (FU), contact up (FU-CU) chips typically require one or more wire bonds above the active layer.
Flip-chip (FC), contact down (FC-CD) chips do not require a wire bond and the light passes through the substrate away from the electrical contacts.
Face-up and contact down (FU-CD) chips do not require wire bonds and light does not pass through the substrate.
Three types of LED substrates are known:
Insulating
Conductive
Conductive with an isolated electrical feed-through.
This provides the 6 types of LED chip configurations.
FU with two wire bonds: One for anode and one for cathode.
FC with no wire bonds.
FU on a conducting substrate with only one wire bond: One electrical contact through the whole substrate.
FU with no wire bonds and a feed-through on the LED substrate: The electrical contact is a similar area to the emitting surface FU with no wire bonds and a feed-through on the LED substrate. The electrical contact is a smaller than the area to the emitting surface and the thermal path is formed with a similar size to the emitting surface.
FU with no wire bonds and no LED substrate so that the anode contact is made directly with the membrane and the cathode is made by a means of an isolated electrical conductor.
Feed-Through Technology:
The requirements are to provide electrical conducting paths from the LED chip side of the membrane to the solder pad side of the membrane. The anode and cathode should be electrically isolated.

A second aspect of the electrical conducting paths is that they also act as a thermally conducting path from the LED chip to the solder pad. This can be through one or both of the paths for anode and cathode.

A third aspect is that the electrically conducting paths are independent of the thermally conducting paths. In this case there is no electrical contact directly under the chip but there is little or no difference in the design so the method of fabrication is identical.

In all cases, the final form maintains a hermetically sealed interface across the membrane.

The isolation of the electrical through contacts can be to include a combined electrical and thermal path of the thermal path can be electrically isolated.

The method of electrical isolation can be in two approaches:
Electrical isolation parallel to the membrane surface i.e. the insulating layer is perpendicular to the thermal heat transfer and typically between the LED chip and the membrane.
The electrical isolation is perpendicular to the membrane surface and parallel to the thermal heat transfer. In this case there is no requirement for an electrical isolation between the LED chip and the membrane.

The advantage of the second method is that the electrical isolating layer is typically a poor thermal conductor and can have a significant impact on the thermal resistance of the membrane overall. When the electrical isolation is not in the thermal path, there can be significant reduction in the thermal resistance of the comparable structures. Additionally, the electrically conducting regions are selectively limited to specific regions in the membrane and the remaining areas of the membrane and frame comprising the platform is electrically neutral.

Another advantage of the defined configurations is that the thermal and electrical regions are isolated creating an anode, a cathode and a thermal contact. This configuration can be advantageously used in the final device application.

The invention claimed is:

1. An LED package, comprising:
an LED chip having an optically active layer on a substrate of length L, and a platform, formed by a supporting frame surrounding a recessed membrane on which the LED chip is mounted in close thermal contact to the material of the platform,
wherein the membrane forms a bottom portion of the platform and is provided with at least one electrically isolated through contact made from electrically isolated and conducting material and connected to an electrode of the LED chip, the thickness of the membrane is less than $3/10$ of the chip length, and the thickness of the supporting frame is more than twice the membrane thickness.

2. The LED package according to claim 1, wherein the thickness of the membrane is less than $1/10$ of the chip length L.

3. The LED package according to claim 1, wherein the electrically isolated and conducting material is a conductor or a semiconductor.

4. The LED package according to any of claim 1, wherein the through contact has the shape of a hole or of planar areas.

5. The LED package according to claim 1, wherein the LED chip on an optically transparent substrate has a thickness of more than three times the membrane thickness.

6. The LED package of claim 5, wherein the LED chip on an optically transparent substrate has a thickness of up to five times the membrane thickness.

7. The LED package of claim 5, wherein the LED chip on an optically transparent substrate has a thickness of more than seven times the membrane thickness.

8. The LED package according to claim 1, wherein the LED chip substrate has a length of at least 300 μm.

9. The LED package according to claim 1, wherein the LED chip on an optically opaque substrate has a thickness of less than three times the membrane thickness.

10. The LED package of claim 9, wherein the LED chip on an optically opaque substrate has a thickness approximately equal to the membrane thickness.

11. The LED package according to claim 1, wherein the LED chip is mounted in flip chip technology and wherein the membrane is provided with two through holes respectively filled with the electrically isolated and conducting material and connected to one of the electrodes of the LED chip.

12. The LED package according to claim 1, wherein the LED chip substrate is made from silicon, sapphire, or silicon carbide.

13. The LED package according to claim 1, wherein the platform comprises an electrical insulator.

14. The LED package according to claim 1, wherein the LED chip is mounted onto the platform without using a separate sub-mount.

15. The LED package according to claim 1, wherein walls surrounding the membrane form a cavity, wherein the walls are designed as a reflector for light emitted from the LED chip.

16. The LED package according to claim 15, wherein the walls of the cavity are coated with a reflecting material.

17. The LED package according to claim 1, wherein the thermal resistance of the membrane of the platform is less than 7 K/W.

18. The LED package according to claim 1, wherein the thermal resistance of the combined membrane and the chip substrate is less than 15 K/W.

19. The LED package according to claim 1, wherein the frame of the platform has a thickness of at least twice the membrane thickness.

20. The LED package of claim 19, wherein the frame of the platform has a thickness at least 10 times the membrane thickness.

21. The LED package of claim 19, wherein the frame of the platform has a thickness at least 25 times the membrane thickness.

22. The LED package according to claim 1, wherein the recessed membrane is made by an etch process into a silicon-on-insulation (SOI) bonded wafer.

23. The LED package according to claim 1, wherein the recessed membrane is made by an etch process into a silicon or silicon carbide wafer.

24. The LED package according to claim 1, wherein a cavity defined by the recessed membrane is at least partially filled with a color conversion material.

25. The LED package of claim 1, wherein the platform comprises silicon or silicon carbide.

26. A method for manufacturing an LED package with improved thermal properties, comprising:
preparing a platform having a membrane with a thickness of less than 1/10 of an LED chip length and forming a bottom portion of the platform, and a frame integrally formed with the membrane and having a thickness which is substantially larger than the thickness of the membrane, wherein during the preparation the membrane is always supported by the frame, the membrane being provided with at least one electrically isolated through contact made from electrically isolated and conducting material and connected to an electrode of an LED chip, and mounting the LED chip on the membrane.

27. The method according to claim 26, wherein mounting the LED chip comprises selecting an LED chip having a substrate with a thickness such that the substrate of the LED chip, together with the frame of the platform, procures sufficient mechanical properties to the LED package.

28. The method according to claim 26, comprising selecting the materials of the LED chip substrate and the platform, respectively, such that they have essentially comparable thermal characteristics.

29. The method according to claim 26, wherein the thermal resistance of the membrane of the platform is less than 7 K/W.

30. The method according to claim 26, wherein the thermal resistance of the combined membrane of the platform and the LED substrate is less than 15 K/W.

* * * * *